United States Patent [19]

Sato et al.

[11] 4,326,297
[45] Apr. 20, 1982

[54] NOISE SUPPRESSING DEVICE IN FM RECEIVER

[75] Inventors: Reisuke Sato; Yoshiro Sugai, both of Tokorozawa, Japan

[73] Assignee: Pioneer Electronic Corporation, Tokyo, Japan

[21] Appl. No.: 144,095

[22] Filed: Apr. 28, 1980

[30] Foreign Application Priority Data

Apr. 28, 1979 [JP] Japan .................................. 54-52906
Apr. 28, 1979 [JP] Japan .................................. 54-52907

[51] Int. Cl.³ .............................................. H04B 1/10
[52] U.S. Cl. .................................... 455/213; 455/266; 455/222; 455/311
[58] Field of Search ............... 455/212, 218, 219, 213, 455/222–225, 296, 311, 312, 266

[56] References Cited

U.S. PATENT DOCUMENTS 2,969,459  1/1961  Hern ..................................... 455/212
4,066,845  1/1978  Kishi ..................................... 455/212
4,178,552  12/1979  Amazawa et al. .................. 455/224

FOREIGN PATENT DOCUMENTS 52-10610  1/1977  Japan ................................... 455/212

*Primary Examiner*—Jin F. Ng
*Attorney, Agent, or Firm*—Sughrue, Mion, Zinn, Macpeak and Seas

[57] ABSTRACT

An FM receiver including a noise suppressing circuit in which the signal from which the noise is detected is taken from a front-end section of the receiver and a correction to the noise is made prior to the detector of the receiver. The noise is suppressed by terminating the received signal upon detection of the presence of noise and holding the level which was present before the noise was detected for a predetermined period of time. By detecting the noise in a signal from the front end of the receiver and by making the correction prior to the detector circuit, only a very short predetermined time period need be used and no complicated pilot signal processing circuit is required.

2 Claims, 7 Drawing Figures

NOISE SUPPRESSING DEVICE IN FM RECEIVER

BACKGROUND OF THE INVENTION

The present invention relates to a noise suppressing device for an FM stereophonic receiver. More particularly, the invention relates to a pulsive noise suppressing device therefor.

FM receivers suffer especially from pulsive noise components such as are caused by ignition plugs or wipers of automobiles. In order to suppress such pulsive noise components, a pulsive noise suppressing circuit is typically provided in which a high-pass filter is provided for detecting or separating pulsive noise components from the output signal from the receiver's FM detector. The noise component separated by the filter is amplified and used to trigger a monostable multivibrator which produces a gate control signal for a predetermined period of time. In response to the gate control signal, a gate circuit is opened to temporarily interrupt the transmission of the detector output signal to the receiver's MPX (multiplex) demodulation circuit. A hold circuit is provided which samples and holds the detector output signal level provided immediately before the opening of the gate for a predetermined period of time after the opening of the gate circuit. The output thus held is substituted for the MPX demodulation input during this period.

In such a pulsive noise suppressing circuit, the detector output signal obtained from the FM detector is employed to suppress the pulsive noise signal. While passing through the many circuits and filters from the RF (radio frequency) stage to the FM detector stage, the phase of the signal is shifted and the width of the noise pulse is increased. Accordingly, it is necessary to prolong the interruption period of the gate circuit. Hence, a significant amount of noise which is attributed to operation of the noise suppressing circuit appears in the audio output signal. This is an undesirable phenomenon. (This phenomenon is illustrated in FIGS. 1A and 1B.)

A stereophonic pilot signal is superimposed on the detector output signal. If the level of the pilot signal is greater than the amplitude of the information signal at the instant of the switch, substantially the level of the pilot signal will be held by the hold circuit and applied to the MPX demodulation circuit for the interruption period of the gate circuit. As a result, a noise signal proportional to the pilot signal level occurs in the audio output. This difficulty may be eliminated by employing a technique in which the pilot signal is extracted from the composite signal and the pilot signal thus extracted is applied to the noise suppressing circuit. However, this technique is still disadvantageous in that a 19 KHz pilot signal processing circuit is necessary in order to accurately transmit the pilot signal to the MPX demodulation circuit.

Accordingly, an object of the invention is to provide a pulsive noise suppressing device for an FM stereophonic receiver in which noise signals can be suppressed more completely but in which a 19 KHz pilot signal processing circuit is not required.

SUMMARY OF THE INVENTION

This, as well as other objects of the invention, are met by a noise eliminating device for an FM receiver including an FM detector, noise detecting means for detecting a noise component in a received signal at a stage of the receiver prior to the FM detector for producing a noise detection signal for a predetermined period of time, frequency data signal generating means for generating a frequency data signal corresponding to the frequency of the received signal, oscillator means controlled by the frequency data signal for producing an output signal whose frequency is equal to the frequency of the received signal with the output signal of the oscillator means being coupled as an input to the FM detector, gating means for cutting off the frequency data signal in response to the detection signal for the predetermined period of time, and holding means for holding a value of the frequency data signal which was present immediately before the operation of the gating means to cut off the frequency data signal, the frequency data signal thus held being utilized as a frequency control signal for operating the oscillator means for the predetermined period of time. The holding means is preferably a capacitor coupled to the output of the gating means.

The oscillator means in some preferred embodiments is a voltage-controlled oscillator. The frequency data signal generating means may include a phase comparator for comparing the phase and/or frequency of the received signal and those of the output signal of the oscillator means, with the frequency data signal so produced representing the difference therebetween, and a low-pass filter receiving an output of the phase comparator. The gating means preferably is constructed of a gating circuit coupled between the output of the low-pass filter and the holding means.

BRIEF DESCRIPTION OF THE DRAWINGS

The above and other objects, features and advantages of the invention will be apparent from the following detailed description of illustrative embodiments shown in the accompanying drawings, in which.

DESCRIPTION OF THE PREFERRED EMBODIMENTS

Preferred embodiments of the invention will be described with reference to the accompanying drawings.

Figure 2:
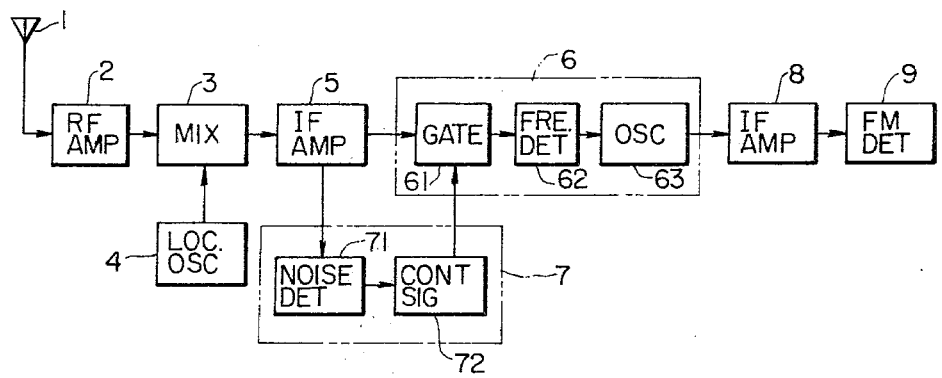
FIG. 2 is a block diagram of a first preferred embodiment of the invention.

FIG. 2 is a block diagram for a description of a first embodiment of the invention. A signal received through an antenna 1 is applied to an RF amplifier where it is amplified. The output of the RF amplifier 2 is then applied to a mixer 3 where it is mixed with a local oscillation signal fed from a local oscillator 4 as a result of which an IF (intermediate frequency) signal is provided. The IF signal is selectively amplified by an IF amplifier 5 and is then applied to a noise eliminating section 6. The noise eliminating section 6 includes a gate 61 adapted to control the transmission of the IF signal to the following stage, a frequency detector 62 which receives the output of the gate and performs a holding function, and a controlled oscillator 63 whose oscillation frequency is controlled in response to the output of the frequency detector 62.

The frequency detector 62 detects the frequency of the IF signal and produces a frequency data signal corresponding to the frequency thus detected. The frequency detector 62 also has a holding function such that when the gate 61 is opened, the frequency data signal which was present immediately before the gate 61 is opened is held. The oscillation frequency of the oscillator 63 is controlled in accordance with the frequency data signal as a result of which an oscillation output having a frequency equal to the IF signal frequency is produced.

The output of the oscillator 63 is amplified by an IF amplifier 8. The output thus amplified is subjected to FM detection by an FM detector 9 where it is converted into a composite detector output signal.

A noise detecting section 7 is provided for controlling the gate 61. The noise detecting section 7 includes a noise detector 71, which detects and amplifies the pulsive noise of the IF signal, and a control signal generator 72 which is triggered by the detection output of the noise detector 71 and in response thereto produces a gate signal for a predetermined period of time. The gate signal is coupled as a control signal of the gate 61.

In the circuit thus constructed, when no noise is present in the IF signal, no gate control signal is produced and therefore the gate 61 is maintained in a closed condition. Accordingly, the IF signal output from the IF amplifier 5 is delivered to the frequency detector 62 and a frequency data signal corresponding in a ratio of 1:1 to the IF signal frequency is outputted. The oscillator 63 is controlled in accordance with the frequency data signal to produce a signal whose frequency is equal to the IF signal frequency which is applied to the IF amplifier 8. In this manner, the circuit carries out the usual signal reception operation.

If, on the other hand, a significant pulsive noise component is present in the IF signal, then a gate control signal is produced by the noise detector 7 to open the gate 61 for the predetermined period of time. In this case, the IF signal is not transmitted to the frequency detector 62 and therefore the generation of the frequency data signal is interrupted. However, as the detector 62 holds the frequency data signal which was present immediately before the gate was opened, the oscillation output of the oscillator 63 will remain the same as the IF signal frequency present immediately before the gate was opened so long as the gate remains open. That is, the output which is detected and reproduced for the period that the gate is open is the level present before the gate was opened.

Figure 3:
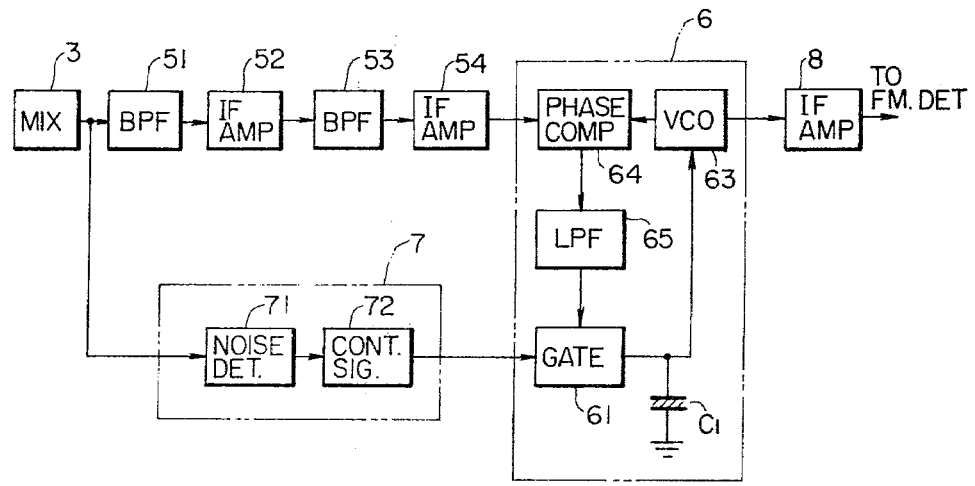
FIG. 3 is a block diagram showing a further example of the first embodiment shown in FIG. 2.

FIG. 3 is a block diagram of a specific example of the above-described first embodiment of the invention in which the components which have been previously described with reference to FIG. 2 are designated by like reference numerals or characters. In FIG. 3, the IF stage includes a BPF (bandpass filter) 51, an IF amplifier 52, a BPF 53 and an IF amplifier 54. The IF output from the mixer 3 is applied to the noise detecting section 7. A noise eliminating section 6 is constructed with a PLL (phase-locked loop) circuit. The noise eliminating section 6 includes a phase comparator 64 in which the frequency and phase of the output signal of the IF amplifier 54 and those of the output of a VCO (voltage-controlled oscillator) 63 are compared in phase, and a comparison signal corresponding to the difference in phase therebetween is produced. The comparison output is applied through an LPF (low-pass filter) 65 to the gate 61. The output of the gate 61 is applied through a holding capacitor $C_1$ to the VCO 63. That is, the output of the gate 61 is employed as the control voltage signal of the VCO 63. The output of the VCO 63 is applied as an input signal to the IF amplifier 8.

When the PLL circuit is in a locked state, the output of the LPF 65 is a DC voltage the value of which corresponds to the IF signal frequency. This DC voltage is utilized as the control signal of the VCO 63. Therefore, the output of the VCO coincides exactly with the IF signal frequency. Thus, a frequency detector is constituted by the phase comparator 64 and the LPF 65.

If a significant noise component is present in the IF signal, then the gate 61 is opened for a predetermined period of time as stated above. This action opens the loop of the PLL circuit and, accordingly, the output of the LPF 65 is no longer directly coupled to the VCO 63. However, the DC voltage which was present immediately before the gate was opened is held by the capacitor $C_1$. Thus, after the gate 61 is opened, the VCO 63 continuously produces an oscillation output whose frequency is equal to the IF signal frequency which was present immediately before the gate was opened. This suppresses the noise signal component. In the above-described circuit, the holding capacitor is provided as a separate circuit element. However, a capacitor (not shown) provided within the LPF 65 may be used as the holding capacitor.

Figure 4:
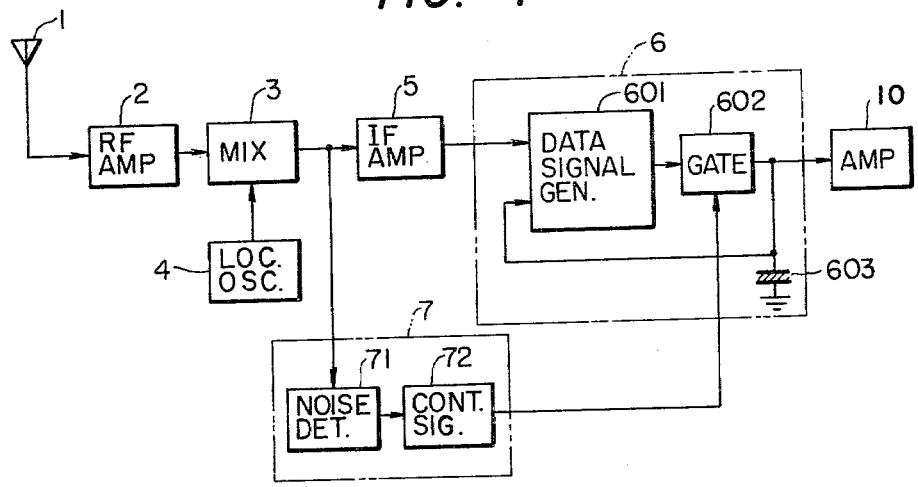
FIG. 4 is a block diagram of a second preferred embodiment of the invention.

FIG. 4 is a block diagram for a description of a second embodiment of the invention in which like numerals used in FIG. 2 designate like components or sections. Similar to the first embodiment shown in FIG. 2, a signal received through an antenna 1 is applied to an RF amplifier 2 where it is amplified. The output of the RF amplifier 2 is applied to a mixer 3 where it is mixed with a local oscillation signal produced by a local oscillator 4 as a result of which an IF signal is provided. The IF signal is selectively amplified by an IF amplifier 5 and is then applied to a noise eliminating section 6. In the noise eliminating section, a variable control type frequency data signal generator 601 is provided which receives the IF signal at one input thereof and a control signal at the other input thereof. The data signal generator 601 generates a reference signal which varies in response to a control signal. A frequency data signal which corresponds to the frequency shift of the IF signal is produced by the data signal generator 601. Specifically, the frequency data signal produced by the data signal generator 601 is a DC voltage whose level varies in correspondence with the input frequency and the output of the data signal generator 601 is applied through a gate 602 to an audio amplifier or MPX demodulator circuit 10 as an audio output or stereophonic composite output. The output of the gate 602 is fed back through a feedback loop to the data signal generator 601 as the control signal input thereof to thereby control the reference signal. A capacitor 603 is provided to hold the output of the gate 602.

In order to control the gate 602, a noise detecting section 7 is provided which includes a noise detector 71 and a control signal generator 72 the function of which is the same as that in the first embodiment shown in FIG. 2. Therefore, a description thereof is unnecessary and is omitted.

In the circuit thus constructed, when no noise component is present in the IF signal, no gate signal is produced and therefore the gate 602 remains closed. Accordingly, the data signal generator 601 is connected in the described feedback loop configuration and produces a DC voltage having a level corresponding in the ratio of 1:1 to the IF signal frequency. This is the FM detection output which is applied through the gate 602 to the amplifier 10.

If, on the other hand, a pulsive noise component is contained in the IF signal, then the gate signal will be produced by the noise detector 7 thereby opening the gate 602 for a predetermined period of time. This opens the feedback loop. However, since the control signal which was present immediately before the gate 602 was opened is held at the holding capacitor 603, while the gate is open, the output corresponds to the IF signal frequency provided immediately before the gate was opened. If this output is utilized as the audio output, the level of the audio output during the open period of the gate is equal to the level present immediately before the gate was opened.

Figure 5:
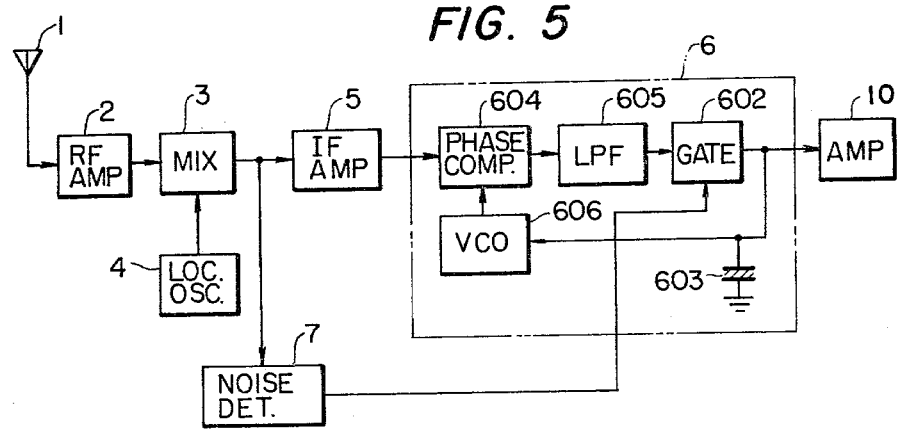
FIG. 5 is a block diagram showing a first example of the second embodiment shown in FIG. 4.

FIG. 5 is a block diagram of a first specific example of the above-described second embodiment in which like numerals designate like components or sections shown in FIG. 4. The data signal generator 601 of the noise eliminating section 6 includes a phase comparator 604, LPF (low-pass filter) 605 and VCO (voltage-controlled oscillator) 606. The output of the LPF 605 is applied to the VCO 606 as a control input thereby constituting a PLL circuit. In this circuit, the reference signal is the output signal of the VCO 606.

In the PLL circuit, the gate 602 is connected so that the PLL circuit is interrupted during the presence of noise. At this time, the voltage on the holding capacitor 603 is utilized as the control input to VCO 606 and the detection output. A capacitor (not shown) provided within the LPF 605 may be used instead of the separate holding capacitor 603 if desired.

Figure 6:
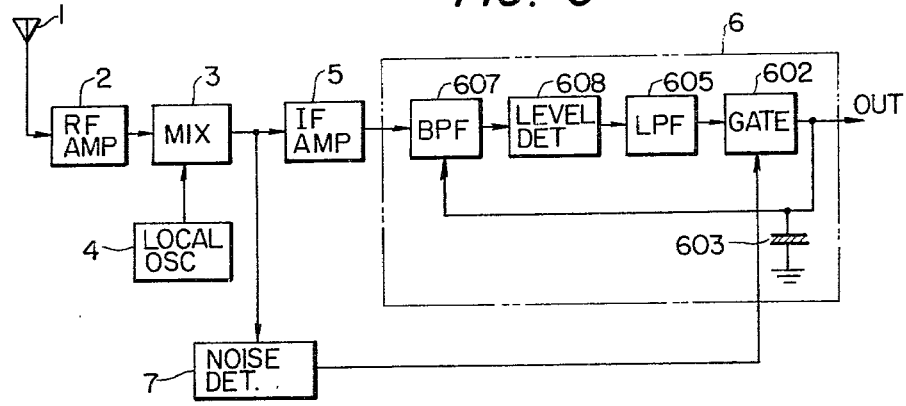
FIG. 6 is a block diagram showing a second example of the second embodiment shown in FIG. 4.

FIG. 6 is a block diagram of a second specific example of the second embodiment described with reference to FIG. 4 in which like numerals designate like components or sections shown in FIG. 4. In this example, the data signal generator 601 shown in FIG. 4 includes a narrow bandwidth BPF (bandpass filter) 607 whose center frequency varies in response to an input control signal, a level detector 608 for detecting the output level of the filter 607, and an LPF 605 to which the level detection output is coupled as its input and which produces a DC voltage whose level varies in response to the IF input frequency. The output of the LPF 605 is applied to the variable BPF 607 as a central frequency control signal. That is, the above-mentioned components constitute an FM detection circuit of a phase tracking loop. In this circuit, when the IF signal frequency shifts from the center frequency of the BPF 607, the level of the filter output will vary in accordance with the amount of shift. By utilizing the fact that the level variations of the output of the filter 605 correspond in a ratio of 1:1 to the IF frequency shifts, the level variation output is used as the audio frequency signal or, more specifically, the composite signal. In this case, the reference signal is a signal corresponding to the central frequency of the BPF 607.

In the phase tracking loop (PTL), a gate 602 is connected so that the PTL circuit is opened during periods when noise has been detected. During these times, the output of the holding capacitor 603 is utilized as the control input to BPF 607 and the detector output. A capacitor (not shown) provided within the LPF 605 may be used instead of the separate holding capacitor 603 if desired.

Figure 1A:
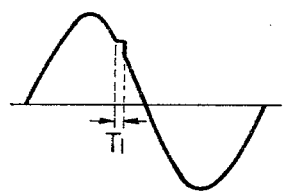
FIGS. 1A and 1B show audio signal waveforms according to the invention and a conventional circuit, respectively.
Figure 1B:
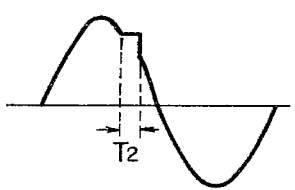

FIGS. 1A and 1B show waveforms of audio signals produced as a result of demodulation and reproduction. FIG. 1A shows an audio signal waveform produced with the utilization of the invention while FIG. 1B shows an audio signal waveform produced by a conventional circuit. With the present invention, the noise signal is eliminated in the IF signal stage and therefore the noise pulse width is much smaller than that in a conventional circuit in which the noise signal is eliminated in a subsequent FM detector stage. Accordingly, the gate closure period $T_1$ used with the invention is much shorter than the corresponding $T_2$ of a conventional circuit. Thus, with the invention, the noise is suppressed to the extent that it is not audibly sensed.

In the above-described embodiments, the noise signal is detected from the output of the mixer 3 to provide the gate signal and the IF signal is applied to the noise eliminating section 6. Therefore, the timing of the generation of the gate pulse and the occurrence of the noise signal in the IF signal are suitably controlled and, accordingly, it is unnecessary to additionally provide a delay circuit or the like for controlling the timing.

As is apparent from the above description, in accordance with the present invention, noise signal components are eliminated prior to the FM detector stage. Therefore, the invention is meritorious in that the open period of the gate is considerably reduced, audio output noise due to the noise eliminating operation is therefore decreased, and it is unnecessary to carry out a pilot signal processing operation. Furthermore, as the circuit makes use of known PLL or PTL circuits, it can be readily manufactured in the form of an integrated circuit.

What is claimed is:

1. A noise eliminating device in an FM receiver comprising:
an FM detector;
noise detecting means for detecting a noise component in a received signal at a stage of said receiver prior to said FM detector for producing a noise detection signal for a predetermined period of time;
said FM detector comprising:
a narrow band width band-pass filter, whose input is an IF signal derived from the received signal, having a center frequency which varies in response to an input control signal;
a level detector having an input coupled to an output of said band-pass filter;
a low-pass filter having an input coupled to an output of said level detector;
gating means having an input coupled to an output of said low-pass filter and operating in response to said noise detection signal, and an output; said input control signal being produced on the output of said gating means and
a holding capacitor coupled to said output of said gating means to hold said input control signal.

2. The noise eliminating device of claim 1 wherein said noise detecting means has an input coupled to an output of a mixer of said receiver.

* * * * *